(12) United States Patent
Li et al.

(10) Patent No.: US 6,545,310 B2
(45) Date of Patent: Apr. 8, 2003

(54) NON-VOLATILE MEMORY WITH A SERIAL TRANSISTOR STRUCTURE WITH ISOLATED WELL AND METHOD OF OPERATION

(75) Inventors: Chi Nan Brian Li, Austin, TX (US); Kuo-Tung Chang, San Jose, CA (US)

(73) Assignee: Motorola, Inc., Schaumburg, IL (US)

( * ) Notice: Subject to any disclaimer, the term of this patent is extended or adjusted under 35 U.S.C. 154(b) by 79 days.

(21) Appl. No.: 09/845,117

(22) Filed: Apr. 30, 2001

(65) Prior Publication Data

US 2002/0158282 A1 Oct. 31, 2002

(51) Int. Cl.[7] .................. H01L 29/76; H01L 29/788
(52) U.S. Cl. ............... 257/314; 257/202; 257/204; 257/211; 257/314; 257/315; 257/323; 257/334; 257/368; 257/390; 257/905; 257/909
(58) Field of Search ................. 257/314–315, 257/323, 334, 368, 202, 211, 204, 390, 905, 909

(56) References Cited

U.S. PATENT DOCUMENTS

| | | | |
|---|---|---|---|
| 4,904,615 A | * 2/1990 | Okuyama et al. | 438/277 |
| 5,789,776 A |  8/1998 | Lancaster et al. | |
| 5,959,879 A | * 9/1999 | Koo | 365/145 |
| 5,994,732 A | * 11/1999 | Ajika et al. | 257/315 |
| 6,025,621 A | * 2/2000 | Lee et al. | 257/296 |
| 6,067,249 A | * 5/2000 | Lee et al. | 365/185.05 |
| 6,115,288 A | * 9/2000 | Amanai et al. | 2/171 |
| 6,160,297 A | * 12/2000 | Shimizu et al. | 257/390 |
| 6,304,508 B1 | * 10/2001 | Uehara et al. | 365/226 |
| 6,307,229 B2 | * 10/2001 | Zatelli et al. | 257/321 |
| 6,310,374 B1 | * 10/2001 | Satoh et al. | 257/298 |
| 6,424,011 B1 | * 7/2002 | Assaderaghi et al. | 257/350 |
| 2001/0002713 A1 | * 6/2001 | Goda et al. | 257/315 |
| 2001/0049168 A1 | * 12/2001 | Ema | 438/241 |
| 2002/0011633 A1 | * 1/2002 | Kumagai | 257/393 |
| 2002/0137281 A1 | * 9/2002 | Watanabe et al. | 438/253 |

* cited by examiner

Primary Examiner—Amir Zarabia
Assistant Examiner—Ida M. Soward
(74) Attorney, Agent, or Firm—Robert L. King; Kim-Marie Vo

(57) ABSTRACT

A first plurality of memory cells (32, 33) connected in series lies within a first well (47) that is separated and electrically isolated (42) from a second plurality of memory cells (36 et al.) connected in series lying within a second well (46). In one embodiment, the first and second wells (46, 47) are doped p-type and are contained within an n-well (48) and a substrate (49). Applying a negative voltage to its corresponding bit line and a positive voltage to its corresponding word line programs a predetermined memory cell within the first plurality. A lesser positive voltage than that applied to the predetermined memory cell's word line is applied to all other bit lines and word lines of non-selected memory cells. By utilizing a negative voltage while programming a memory cell, the magnitude of programming voltages is reduced, thereby, removing the need for an elaborate charge pump to generate a much higher programming voltage.

14 Claims, 5 Drawing Sheets

NON-VOLATILE MEMORY WITH A SERIAL TRANSISTOR STRUCTURE WITH ISOLATED WELL AND METHOD OF OPERATION

RELATED APPLICATION

This application is related to Hu et al., U.S. Ser. No. 09/639,495, entitled "Non-Volatile Memory, Method of Manufacture, And Method of Programming," filed Aug. 15, 2000, now U.S. Pat. No. 6,438,030.

FIELD OF THE INVENTION

This invention relates generally to semiconductor memory devices, and more specifically, to non-volatile memories and memory programming.

BACKGROUND OF THE INVENTION

Conventional memory arrays, such as an electrically erasable programmable read only memory (EEPROM) array, comprise pluralities of individual memory cells. The memory cells can be programmed for desired logic or memory states. In programming the array, each cell must have either a high or low voltage (i.e., on or off) state. The high voltage state that is desirable is limited by power consumption considerations and physical and materials constraints. The low voltage state that is desirable is likewise limited because it must be differentiated from the high voltage state and, yet, it must not result in cross leakage among neighboring cells in tight memory array cell distributions. The higher the voltage required for programming the high states, the greater the power consumed by the memory cells. Typical programming voltages for non-volatile NAND memory arrays are in the range of 18–20 volts. NAND memory arrays are characterized by having a plurality of series-connected transistors in the bit lines. Additional issues which are created with the use of high programming voltages such as 18–20 volts include the requirement of costly and sometimes elaborate charge pumps. As supply voltages associated with semiconductors continue to decrease below the five-volt supply value, the requirements demanded of charge pumps may not be met. Also, to eliminate a disturbance problem with unselected cells when using a high word line voltage during programming operation, the unselected word line voltage is in the range of 9 to 11 volts. Additionally, a voltage in the range of 3 to 5 volts is applied to the drain of a drain select transistor of the unselected bit lines. These voltages are required to create a self-boosting mechanism in the channels of each of the transistors in the unselected bit lines.

Another form of non-volatile memory array is known as a NOR memory array. NOR memory arrays are characterized by the use of parallel-connected transistors in the bit lines. NOR memory arrays are typically much faster than NAND memory arrays, but NAND memory arrays are typically much more compact and dense. As a result, it is sometimes desired to use both a NOR memory array and a NAND memory array in the same integrated circuit. For example, certain embedded memory applications may be more size critical in a particular application, whereas other applications may be more speed critical. However, a problem exists when trying to utilize both a NAND memory array and a NOR memory on the same integrated circuit. Each type of memory array typically requires a significantly different process to manufacture. For example, NAND memory cells sometime require a self-aligned trench structure in a triple polysilicon process. On the other hand, NOR memory cells typically use a non-self-aligned trench with a double polysilicon process. As a result, many commercial manufacturing processes do not permit a designer to implement both types of memory arrays in a single integrated circuit.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
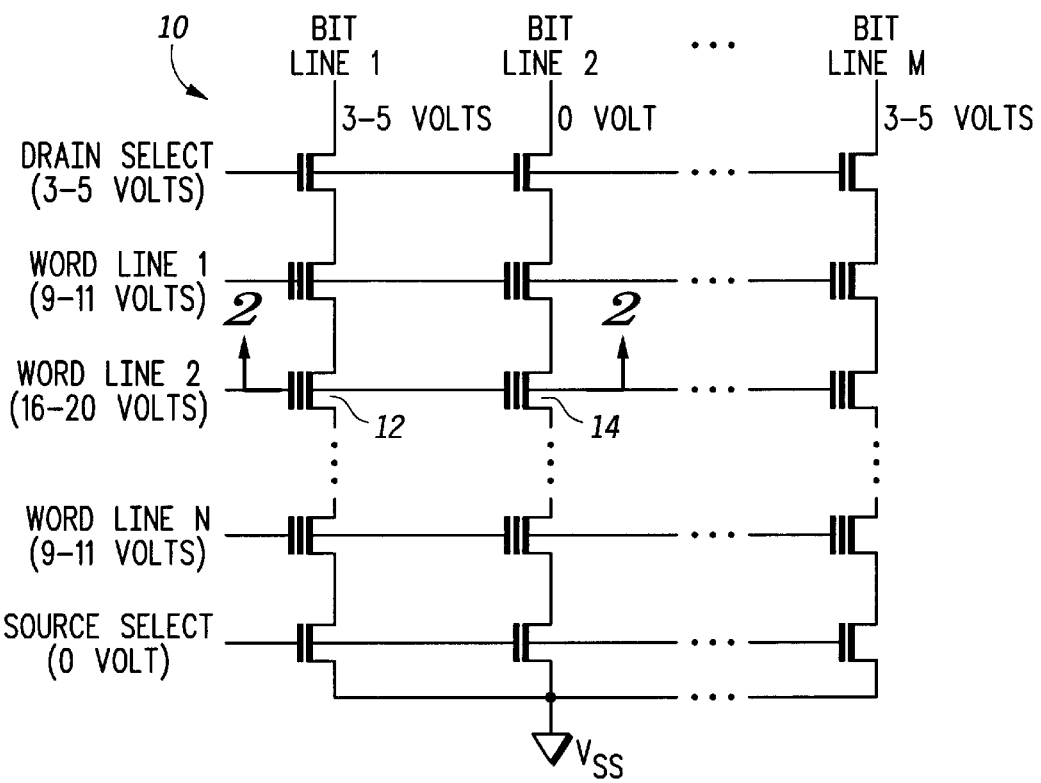
FIG. 1 illustrates in schematic diagram form a known non-volatile memory array.

FIG. 1 illustrates in schematic form a known memory array 10 having a plurality of drain select transistors, source select transistors and N-channel floating gate transistors forming M bit lines and N word lines, where M and N are arbitrary integer values. Each bit line has a predetermined number (as indicated by the broken column lines) of the N-channel transistors connected in series. Gate electrodes of each of the transistors in a predetermined row are connected together to form a predetermined word line. At the top of each bit line is a drain select transistor, and at the bottom of each bit line is a source select transistor. Each source select transistor has a source connected to a supply voltage terminal labeled $V_{SS}$. The value of $V_{SS}$ changes depending upon the operating mode (i.e. programming, read, erase) of memory array 10.

In order to program memory array 10, specific voltages are shown to describe how a user programs either a "one" or "zero" state into transistor 14. Before programming, memory array 10 is erased. To erase memory array 10, an erase voltage of about 16 to 20 volts is applied to the substrate (not shown) of memory array 10. To program memory array 10, specific programming voltages are shown in FIG. 1. Each bit line which does not contain the transistor to be programmed is placed at a voltage of about 3 to 5 volts. The bit line which does contain the transistor to be programmed is placed at zero volts. During programming, the drain select transistors are each made conductive by applying 3 to 5 volts on the gates of the drain select transistors. Concurrently, the source select transistors are made nonconductive by placing zero volts on the gates of each of source select transistor. The gates of all non-selected word lines are placed at a potential of 9 to 11 volts. However, the word line of the selected memory cell to be programmed is placed at an elevated potential of 16 to 20 volts. Under the described voltage conditions, transistor 14 is programmed. To program transistor 14 its floating gate is charged to a sufficient amount to either a one or zero state. Whether a logic one or logic zero state is programmed depends on the programming logic associated with the programming voltage value. This operation is conventional and not germane to the present discussion. It should be noted that to program memory array 10, a programming voltage of 16 to 20 volts is required. Since this voltage may be four to five times (or more) the typical power supply voltage for many memory circuits, obtaining the required voltage may be very problematic.

Additionally, note that transistor 12 of FIG. 1 is not selected to be programmed, but nonetheless receives a gate voltage of 16 to 20 volts. As a result, the floating gate of transistor may also charge to a voltage which comes close to inadvertently programming transistor 12. To correct this issue, all of the unselected word lines must be maintained at a voltage of 9 to 11 volts with a bit line voltage of approximately 3 to 4 volts. Under these bias conditions, the channel potential of transistor 12 is boosted to approximately 7 to 9 volts. As a result, a high gate voltage applied to transistor 12 does not inadvertently program transistor 12. A further disadvantage of memory array 10 includes the requirement to generate the additional different voltages for the bit lines and word lines.

Figure 2:
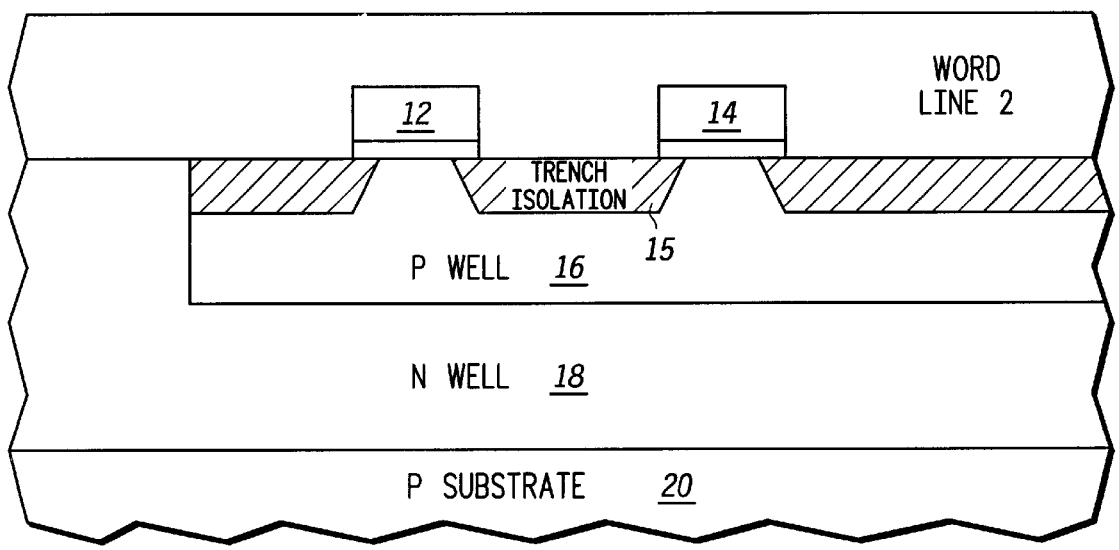
FIG. 2 illustrates in cross-sectional form a view of two transistors sharing a common well in the memory array of FIG. 1.

Illustrated in FIG. 2 is a cross section of transistors 12 and 14 for illustrating the fact that all of the transistors, floating gate and select transistors, are manufactured in a common well. Taking a cross-section along line 2—2 of FIG. 1, it can be seen in FIG. 2 that floating gate 12 of transistor 12 is adjacent floating gate 14 of transistor 14. Transistors 12 and 14 are electrically isolated by a trench isolation region 15. The source and drain of each of transistors 12 and 14 are perpendicular to the illustrated view and are therefore not shown. Transistors 12 and 14 share the same well, P well 16. Below P well 16 is an N well 18 that is immediately above a P substrate 20. Because of the tunnel oxide thickness of the transistors of memory array 10, it takes about 16 to 20 volts across the tunnel oxide to program each transistor. However, because all of the transistors of memory array 10 are contained within P well 16, the magnitude of the required 16 to 20 volt differential may not be reduced by using a negative voltage because a negative voltage applied to the selected bit line will turn on the N+ to P well diode (not shown) between a drain and the common well. The common P well 16 is at zero volts potential. If the well bias to P well 16 is made negative, then selection of bit lines is lost as all bit lines are programmed on the same word line when a lower positive programming word line voltage is used.

Figure 3:
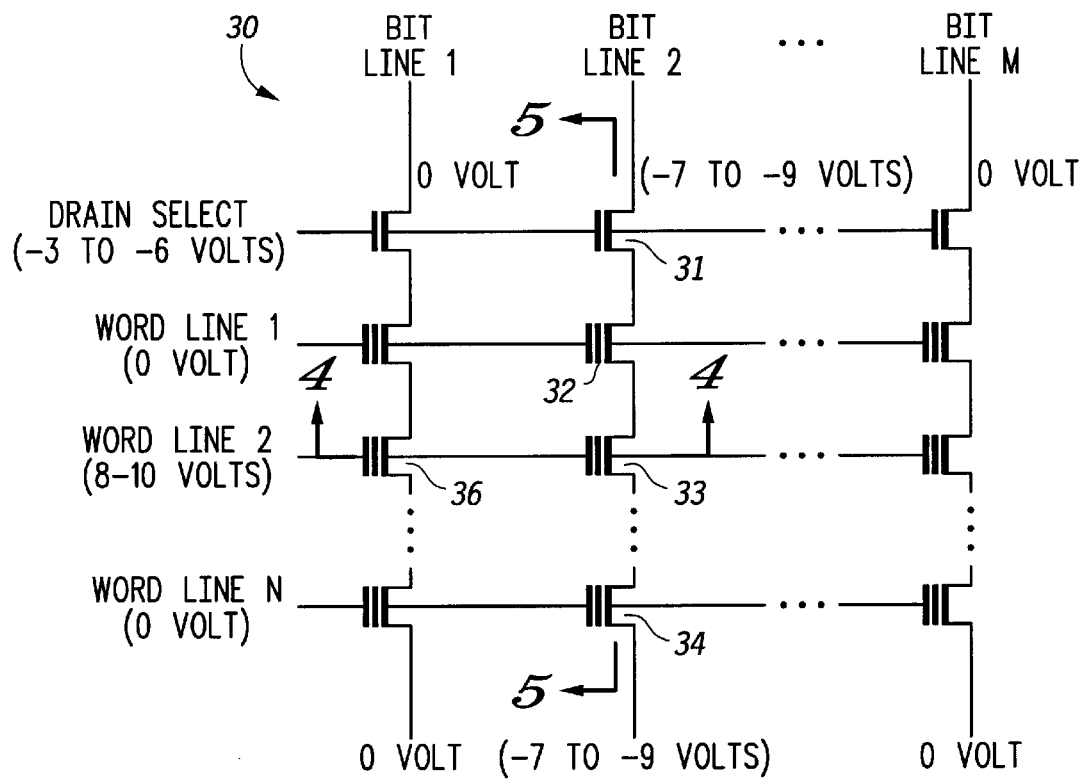
FIG. 3 illustrates in schematic diagram form a non-volatile memory array in accordance with the present invention.

Illustrated in FIG. 3 is a memory array 30 in accordance with the present invention. In one form, memory array 30 is a non-volatile memory (NVM) array. Memory array 30 has a plurality of select transistors and floating gate transistors that form a plurality of M bit lines having series-connected transistors and a plurality of N word lines, where M and N are arbitrary integers. In the illustrated form, assume that bit line 2 has an N-channel select transistor connected in series with N-channel floating gate transistors 32, 33 and 34. An arbitrary number of series-connected transistors (not shown) may be connected between transistor 33 and transistor 34 as indicated by the dots in FIG. 3. The series-connected floating gate transistors 32, 33 through 34 form a first plurality of memory cells and represent a bit line of the non-volatile memory array. Typically, the total number of series-connected transistors in any single bit line is a multiple of two, such as sixteen or thirty-two to form multiple sections of series-connected transistors. Each section is implemented in a reciprocating fashion so that the first section begins with a select transistor having a drain electrode at the top of the layout and a source at the bottom of the layout. A second section is reversed so that it begins with a floating gate transistor having a source electrode at the top of the layout of the second section and a drain of a select transistor at the bottom of the layout. This alternating repeats until the total number of transistors in a desired bit line has been implemented. Because of the need to apply differing voltages to the sources and the drains of the first transistor in each section, two distinct metal conductors are used in a single layer per bit line. In one form, these two distinct metal conductors are implemented as parallel metal conductors per bit line.

It should be further noted that there are no source select transistors in memory array 30. Also, as will be discussed below, each bit line column is electrically isolated from all other bit line columns.

Assume for purposes of illustration only that specific operating voltages are applied to program memory array 30. Before being programmed, memory array is blanket erased by applying a voltage somewhere in a range of approximately 7 to 9 volts on all P wells below the memory array 30. Thus, in the illustrated form memory array 30 is an electrically erasable programmable read only memory (EEPROM). All N wells are placed at a different bias to prevent a PN diode between each N and P well interface from becoming conductive. A voltage within a range of approximately −7 to −9 volts is also applied during the erase mode of operation to all word lines. These voltages ensure that all the floating gates in memory array 30 are discharged to a positive potential so that the threshold voltage, $V_t$, of each bit cell will be approximately −3 volts to −1.5 volt.

To program memory array 30, the drain of the drain select transistors of all non-selected bit lines is placed at substantially zero volt potential. Additionally, the source of the last floating gate transistor in each unselected bit line is also connected to approximately 0 volt. The drain of the drain select transistor of the selected bit line is placed at a voltage in a range approximately of −7 to −9 volts. Additionally, the source of the last floating gate transistor in the selected bit line is also connected to a voltage in a range approximately −7 to −9 volts. This biasing scheme is possible because each bit line is electrically isolated from each other; in other words, the bit lines do not share a common well. Each bit line is a conductive path electrically connecting the drains of transistors in the bit line. Each drain select transistor is biased commonly via the drain select line connecting the gate or control electrodes of all drain select transistors, such as transistor 31, to a voltage in a range of approximately −3 to −6 volts. A selected word line is biased to a voltage in a range of approximately 8 to 10 volts and all non-selected word lines are biased to approximately 0 volt.

In the illustrated form, the programming voltage applied via word line 2 is sufficient to charge the floating gate of transistor 33 when the drain of transistor 33 is biased at a voltage in a range of approximately −7 to −9 volts. This bias scheme creates a high threshold voltage, Vt, for transistor 33 that is either a logic one or logic zero state. No other floating gate transistors in word line 2 are programmed because the drains of the drain select transistors of their respective columns are biased at zero volt. As a result, a sufficient charge is not permitted to accumulate within the floating gates of the other transistors in the word line 2. It should be well understood however that multiple floating gate transistors within word line 2, or all transistors within word line 2, may be concurrently programmed by properly biasing the drain of the respective bit line drain select transistors. To more properly understand the operation of the present invention, a view from line 4—4 of FIG. 3 is made to illustrate why each bit line is electrically isolated from the other bit lines. It should be noted that the present invention requires a programming voltage in the range of only −7 to −9 volts; in other words the magnitude of the programming voltage only needs to be on the order of 7 to 9 volts as contrasted with significantly higher programming voltages required by previous nonvolatile memories. It should be understood that a positive programming voltage may be used if conductivities are reversed. Since programming voltages below ten volts may be reliably used, the design of charge pumps in an integrated circuit that contains the memory array taught herein is greatly simplified and associated costs are reduced. Additionally, it should be noted that the tunnel oxide thickness of the floating gate transistors of the memory array has not been sacrificed (i.e. made thinner) in order to obtain lower programming voltages. The tunnel oxide thickness that is required is a process parameter that must be met in order to maintain a predetermined level of reliable operation.

Figure 4:
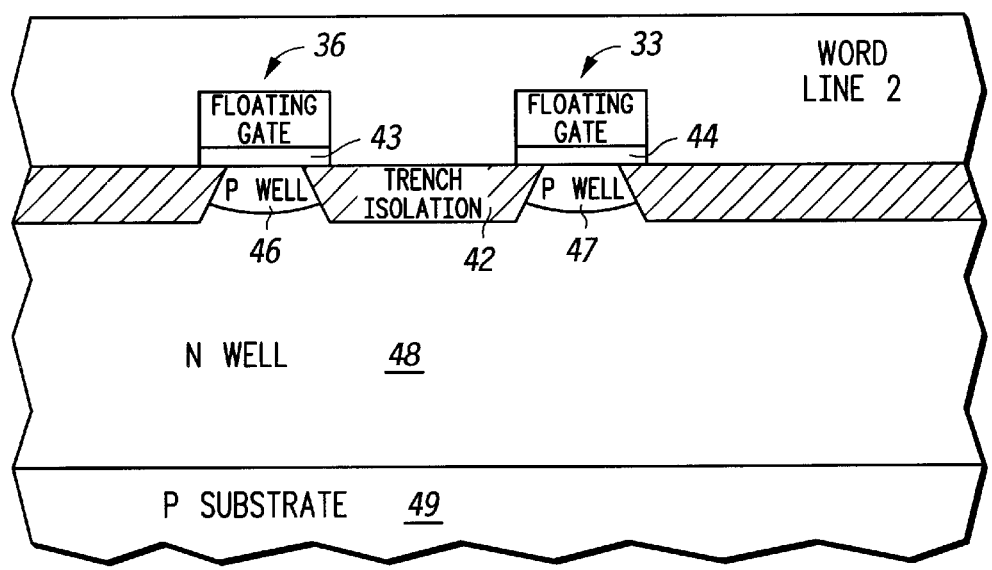
FIG. 4 illustrates in cross-sectional form a view of two transistors having electrically isolated wells in the non-volatile memory array of FIG. 3.

Illustrated in FIG. 4 is a cross-section of transistors 33 and 36 of FIG. 3 which represent two different bit lines. Each of transistors 33 and 36 is controlled by word line 2 that overlies and surrounds each of the floating gates for transistors 33 and 36. Although not explicitly shown, the word line 2 and the floating gate are separated by an ONO (oxide-nitride-oxide) insulating layer as is conventional in the art. Immediately below each floating gate structure is respectively a tunnel oxide 43, 44 that separates each floating gate from a P-well 46 region a P-well 47 region, respectively. The P wells 46 and 47 are separated by an insulator or isolation structure, such as a shallow trench isolation region 42. The structures described above are formed within an N-well 48 region which functions as additional isolation between P well 46 and P well 47. N-well 48 is within a P substrate 49. It should be well understood that the specific conductivities are provided by example only and that the present invention may be implemented by reversing the illustrated conductivities. Additionally, the N-well 48 may be replaced with a buried oxide in an SOI (silicon-on-insulator) structure.

Figure 5:
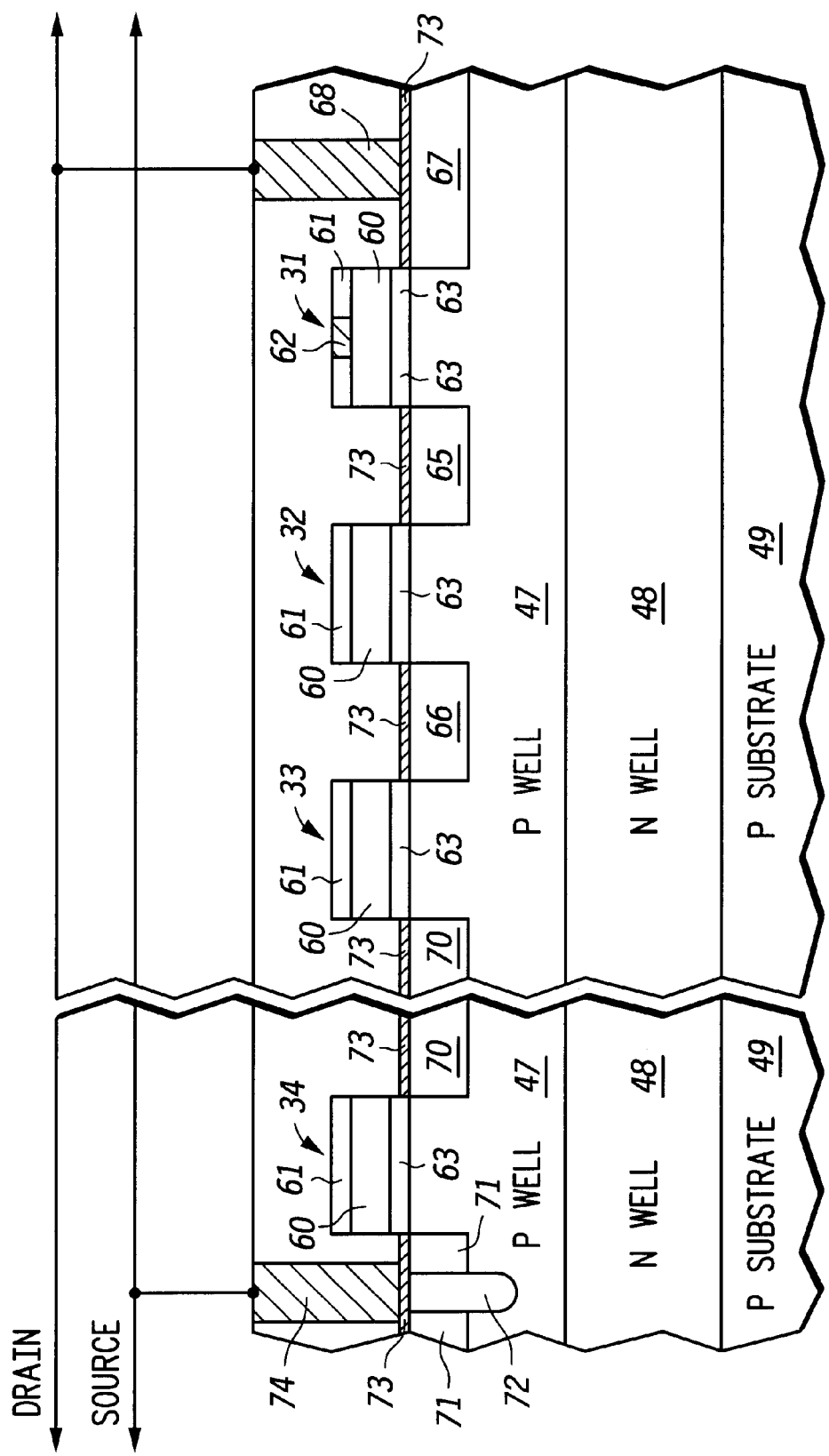
FIG. 5 illustrates in cross-sectional form serially connected transistors of a bit-line of the non-volatile memory array of FIG. 3.

Illustrated in FIG. 5 is a view 5—5 from FIG. 3 of bit line 2 having drain select transistor 31 and floating gate transistors 32–34. For convenience of illustration, elements which are common between FIG. 4 and FIG. 5 are identically numbered. In the illustrated form, drain select transistor 31 is a floating gate structure which has a floating gate 60 electrically short circuited with a control gate 61 via a tungsten plug 63. Floating gate 60 overlies a tunnel oxide layer 63. Transistor 31 shares a common diffusion 65 with transistor 32 for source/drain electrodes, respectively. Similarly, transistor 32 and transistor 33 share a common diffusion 66. Each of transistors 32, 33 and 34 has a control gate (not numbered) overlying a floating gate (not numbered) with an intervening insulating dielectric layer such as ONO. Transistor 31 has a drain diffusion 67. A tungsten plug 68 is connected to drain diffusion 67 for forming an external contact. As indicated by the break in the middle of FIG. 5, additional transistors (not shown) may be inserted in series between transistor 33 and transistor 34. Transistor 34 is a floating gate structure having a drain diffusion 70 and a source diffusion 71. Within source diffusion 71 is a P+ diffusion 72 that electrically connects the source of transistor 34 to P well 47. Overlying source diffusion 71 and P+ diffusion 72 is a silicide layer 73. External contact to the source diffusion 71 and P well 47 is made via silicide layer 73 by using a tungsten plug 74.

It should be noted that there is no external contact between the series connected floating gate transistors, such as between transistors 32 and 33. Therefore, the size of a single bit cell is significantly reduced resulting in a compact and efficient physical layout. It should be further noted that as a result of electrically isolating each bit line in the memory array, there is no need for a source select transistor in each bit line column.

Figure 6:
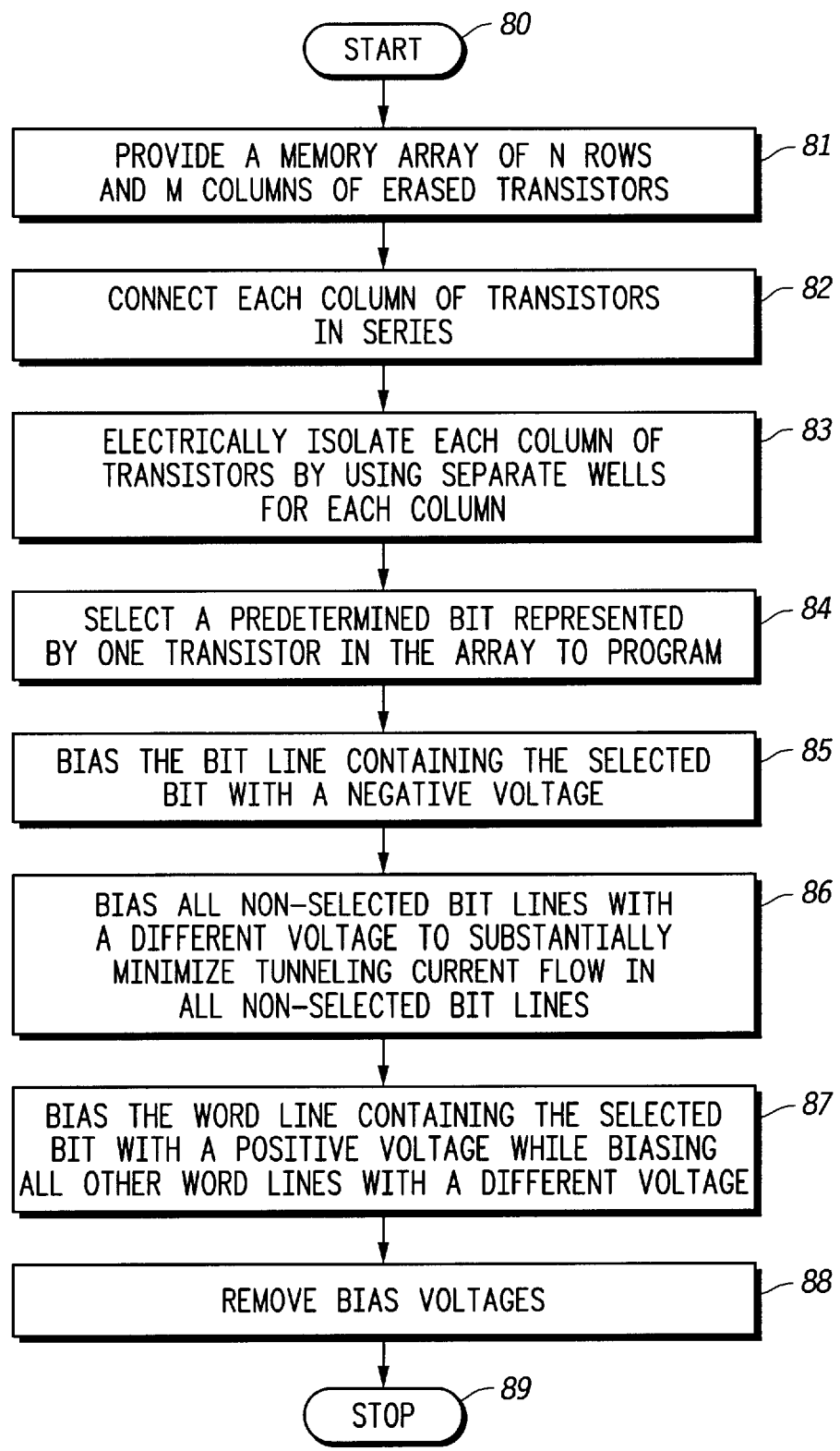
FIG. 6 illustrates in flow chart form a process for programming the non-volatile memory array of FIG. 3 in accordance with the present invention.

Illustrated in FIG. 6 is a method for operating a non-volatile memory with a serial transistor structure with isolated wells. After a start step 80, a step 81 is initiated by providing a memory array of N rows and M columns of erased transistors. In a step 82, each of the M columns of transistors is electrically connected in series. In a step 83, each of the M columns of transistors is electrically isolated by using separate wells for each column. In a step 84, a selection is made of a predetermined bit or memory cell to program. The bit is represented by one transistor in the array. It should be well understood that multiple bits are programmed concurrently, but this example is focused on a single bit being programmed for tutorial purposes. In a step 85, the bit line that contains the selected bit to be programmed is biased with a negative voltage. Again, it should be well understood that the bit line functions equally being biased with a voltage of opposite sign (i.e. positive to negative or negative to positive) or polarity by modifying the conductivities from that shown above. In a step 86, all non-selected bit lines are biased with a different voltage to substantially minimize tunneling current flow in all non-selected bit lines. In a step 87, the word line containing the selected bit is biased with a positive voltage while biasing all other word lines with a different voltage than the voltage used to bias the word line containing the selected bit. This operation completes the biasing required to program the memory array. In a step 88, all bias voltages are removed and in a step 89 the operation is stopped.

Figure 7:
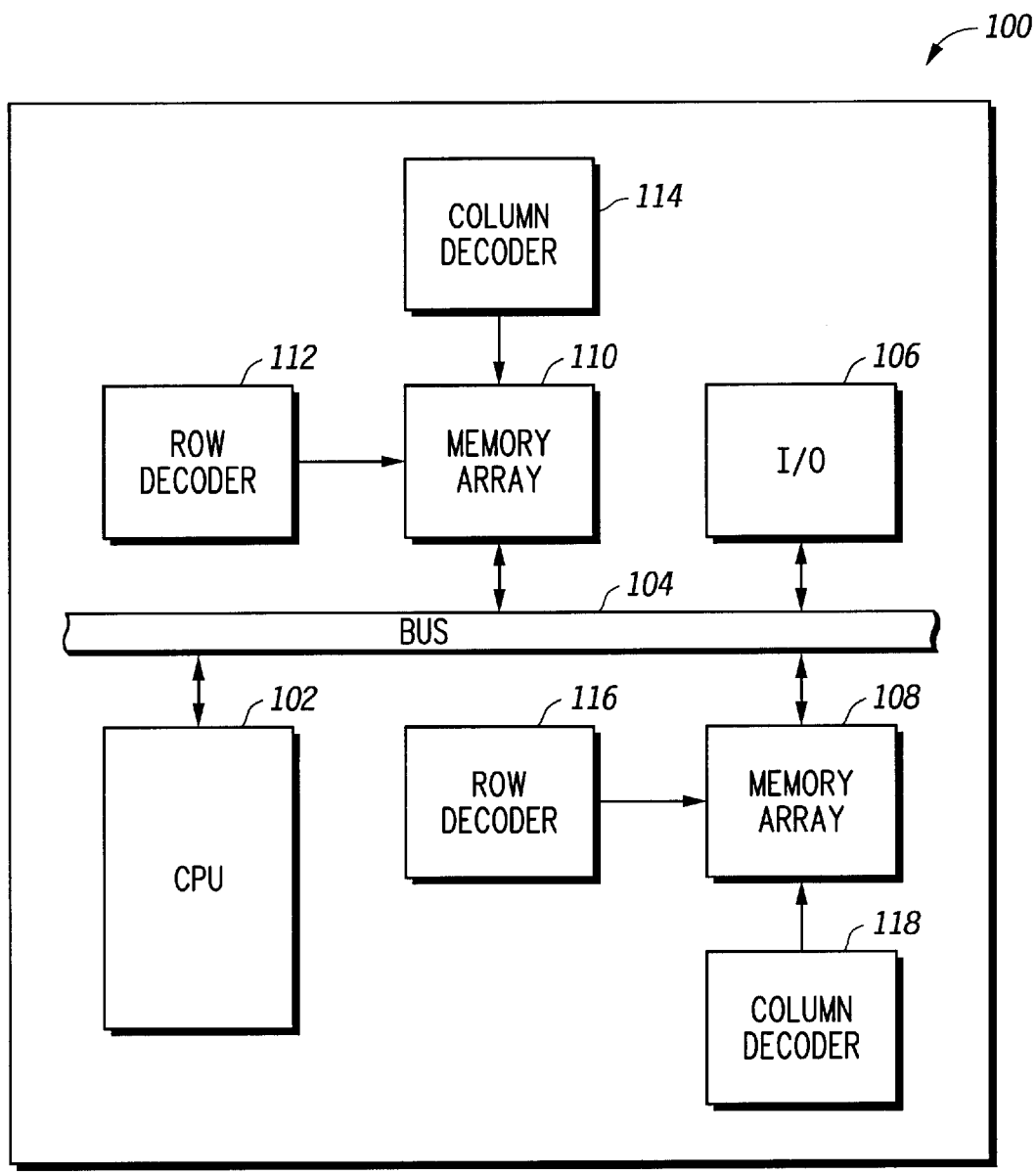
FIG. 7 illustrates in block diagram form a single integrated circuit (chip) having two memory arrays of differing memory architectures in accordance with the present invention.

Illustrated in FIG. 7 is a semiconductor device 100 having a central processing unit (CPU) 102 connected to a global bus 104. An input/output (I/O) unit 106 is connected to bus 104. Separate and distinct memory arrays in the form of memory array 108 and memory array 110 are connected to bus 104. A row decoder 112 is connected to memory array 110, and a column decoder 114 is connected to memory array 110. A row decoder 116 is connected to memory array 108, and a column decoder 118 is connected to memory array 108.

In the semiconductor device 100, memory array 108 and 110 are implemented as two different types of non-volatile memories (NVMs) on a same integrated circuit. In particular, memory array 108 is implemented as a NAND memory architecture NVM and memory array 110 is implemented as a NOR memory architecture NVM. The NOR architecture NVM is implemented using parallel-connected floating gate transistors having the same semiconductor structure as the illustrated structure for the series-connected transistors. As a result of the present invention and the semiconductor structures taught herein, the process required to implement the NAND architecture NVM array is now the same as the process steps required to implement a conventional NOR architecture NVM array. As a result, process steps to manufacture the bit cells may be optimized at the same time for both the NOR and NAND architecture memories. In other words, process characterizations such as natural threshold voltage, coupling ratio, source and drain junction profile, and trench isolation, are made to be compatible to make different and independent memory array architectures on a single integrated circuit. For example, the bit line and word line circuitry for the two memory arrays of differing memory architecture are separate and independent bit line and word line circuits.

By now it should be appreciated that there has been provided a nonvolatile memory array using a NAND architecture (i.e. series-connected transistors) with a relatively low programming voltage as compared with prior NVM circuits. The array operation is simplified by eliminating a need for having both an unselected word line voltage and self-boosting. Because the source/drain and well are always at the same potential during high voltage operation, there is a minimum risk of junction break down and source/drain punch-through. Because there are no layout contacts between rows of floating gate transistors, the memory cell size is much reduced as compared to NOR (parallel-connected transistor) memory cells.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, although the present invention has been illustrated as being implemented with MOS transistors, it should be well understood that any other types of transistor may be used, including transistors that may not be presently available. Additionally, as semiconductor geometries decrease and manufacturing processes change, the specific voltages illustrated may no longer be accurate and lower or different voltages may be utilized in the practice of the present invention. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A non-volatile memory array comprising:
   a first bit line electrically connected to a first plurality of memory cells, wherein all of the first plurality of memory cells are within a first well and are connected in series;
   a second bit line that is electrically isolated from the first bit line and is electrically connected to a second plurality of memory cells, wherein all of the second plurality of memory cells are within a second well and are connected in series; and
   an isolation region separating the first plurality of memory cells from the second plurality of memory cells for making the second bit line electrically isolated from the first bit line, the first well and the second well each having a cross-sectional depth that is less than a depth of the isolation region.

2. The non-volatile memory array of claim 1 wherein the isolation region is a shallow trench isolation region.

3. The non-volatile memory array of claim 1 further comprising:
   a word line connecting one of the first plurality of memory cells to one of the second plurality of memory cells.

4. The non-volatile memory array of claim 1 wherein the first well and the second well are within a third well.

5. The non-volatile memory array of claim 4 wherein the first and second wells are p-well regions.

6. The non-volatile memory array of claim 5 wherein the third well is an n-well region.

7. The non-volatile memory array of claim 1 further comprising:
   a first transistor connected to the first bit line;
   a second transistor connected to the second bit line; and
   a drain select line connecting the first transistor to the second transistor.

8. A non-volatile memory array comprising;
   a first memory cell within a first well and electrically connected to a first bit line;
   a second memory cell within a second well which is electrically separated from the first well by an isolation region having a cross-sectional depth that is greater than cross-sectional depth of each of the first well and the second well, the second memory cell being connected to the first memory cell by a word line and electrically connected to a second bit line;
   a third memory cell serially connected to the first memory cell and contained within the first well; and
   a fourth memory cell serially connected to the second memory cell and contained within the second well.

9. The non-volatile memory array of claim 8, wherein the non-volatile memory array is on a same integrated circuit with a second non-volatile memory array, the second non-volatile memory array having a different memory architecture from the non-volatile memory array and having separate and independent bit line and word line circuitry from the non-volatile memory array.

10. The non-volatile memory array of claim 8 wherein the isolation region is a shallow trench isolation region.

11. A semiconductor device having an electrically erasable programmable read only memory (EEPROM) array of memory cells comprising:
    a first p-well region within a semiconductor substrate;
    a second p-well region within the semiconductor substrate, wherein the second p-well region is spaced apart and electrically isolated from the first p-well region by an isolation region having a cross-sectional depth that is greater than cross-sectional depths of the first p-well region and the second p-well region;

a first column of memory cells all contained within the first p-well region;

a second column of memory cells all contained within the second p-well region;

a first bit line comprising a first conductor electrically connected to a first current electrode of a first transistor in the first column of memory cells and selectively serially making electrical contact to all memory cells in the first column of memory cells; and a second bit line electrically isolated from the first bit line and comprising a second conductor electrically connected to a first current electrode of a first transistor in the second column of memory cells and selectively serially making electrical contact to all memory cells in the second column of memory cells.

12. A semiconductor device comprising:

a semiconductor substrate;

a first well within the semiconductor substrate, wherein the first well has a first conductivity type;

a second well and a third well, wherein:
   the second and third wells are separated by an isolation structure having a first depth that is greater than each of a second depth of the second well and a third depth of the third well;
   the second and third wells are within the first well; and
   the second and third wells are doped a second conductivity type that is different than the first conductivity type;

a first memory cell overlying the second well;

a second memory cell overlying the third well;

a first word line electrically coupling the first memory cell and the second memory cell;

a third memory cell overlying the second well;

a first bit line electrically coupled to the third memory cell and the first memory cell; and a second bit line electrically isolated from the first bit line and coupled to the second memory cell.

13. The semiconductor device of claim 12 wherein the isolation structure is a shallow trench isolation region.

14. The semiconductor device of claim 12 wherein the first conductivity type is n-type.

* * * * *